(12) United States Patent
Murakami et al.

(10) Patent No.: US 8,279,612 B2
(45) Date of Patent: Oct. 2, 2012

(54) ELECTRONIC CIRCUIT DEVICE

(75) Inventors: Naotaka Murakami, Anjo (JP); Keiichi Tominaga, Nagoya (JP); Masato Matsubara, Toyota (JP)

(73) Assignees: Aisin AW Co., Ltd., Aichi-Ken (JP); Toyota Jidosha Kabushiki Kaisha, Aichi-ken (JP)

( * ) Notice: Subject to any disclaimer, the term of this patent is extended or adjusted under 35 U.S.C. 154(b) by 302 days.

(21) Appl. No.: 12/719,331

(22) Filed: Mar. 8, 2010

(65) Prior Publication Data
US 2010/0232115 A1 Sep. 16, 2010

(30) Foreign Application Priority Data
Mar. 13, 2009 (JP) ................................. 2009-060724

(51) Int. Cl.
*H05K 1/00* (2006.01)

(52) U.S. Cl. ........ 361/749; 361/760; 361/767; 361/782; 174/254; 174/258

(58) Field of Classification Search .......... 361/749–750; 174/254–258
See application file for complete search history.

(56) References Cited

U.S. PATENT DOCUMENTS

| | | | | |
|---|---|---|---|---|
| 4,950,527 A | * | 8/1990 | Yamada | 428/192 |
| 5,378,859 A | * | 1/1995 | Shirasaki et al. | 174/261 |
| 6,858,921 B2 | * | 2/2005 | Kashiwagi et al. | 257/668 |
| 7,371,971 B2 | * | 5/2008 | Takayoshi et al. | 174/255 |
| 2002/0066946 A1 | | 6/2002 | Takatsu | |

FOREIGN PATENT DOCUMENTS

| | | |
|---|---|---|
| JP | 5-013904 A | 1/1993 |
| JP | 2000-294604 A | 10/2000 |
| JP | 2006-140273 A | 6/2006 |
| JP | 2006-319265 A | 11/2006 |
| JP | 2007-088228 A | 4/2007 |

OTHER PUBLICATIONS

International Search Report (PCT/ISA/210) for PCT/JP2010/051216 mailed May 11, 2010, 3 pages.

* cited by examiner

*Primary Examiner* — Tuan T Dinh
(74) *Attorney, Agent, or Firm* — Sughrue Mion, PLLC

(57) ABSTRACT

An electronic circuit device including a circuit board having electronic parts, and a flexible wiring board for connection between the circuit board and external equipment. The circuit board has circuit-side connection terminals juxtaposed on a mount surface having the electrical parts mounted thereon or a non-mount surface. The wiring board has terminals juxtaposed on one of the surfaces thereof so that the wiring-board-side connection terminals confront the circuit-side circuit board connection terminals, and free-end portions each formed so as to include at least one of the wiring-board-side connection terminals, and the wiring board free-end portions are not adhesively attached to the circuit board, and the circuit-side connection terminals are electrically connected to the corresponding wiring-board-side connection terminals while the circuit-side connection terminals confront the wiring-board-side connection terminals.

7 Claims, 10 Drawing Sheets

ELECTRONIC CIRCUIT DEVICE

CROSS-REFERENCE

Japanese Patent Application No. 2009-060724 filed on Mar. 13, 2009 including the specification, drawings and abstract is incorporated herein by reference in its entirety.

BACKGROUND OF THE INVENTION

1. Field of the Invention

The present invention relates to an electronic circuit device, and particularly to an electronic circuit device including a circuit board on which electronic parts are mounted.

2. Description of the Related Art

As this type of electronic circuit device has been hitherto proposed an electronic device equipped with a circuit board having electronic parts mounted therein and plural lands formed on the surface thereof so that bumps or conductive balls are joined to the plural lands, a flexible wiring board having wiring conductors which are patterned in a resin film having flexibility and an electric insulating property so as to extend in a direction separating from the circuit board, and lands for the wiring conductors which are connected to the bumps or conductive balls of the circuit board, and mold resin for sealing an electrical connection portion between the flexible wiring board and the circuit board through the electronic parts, the circuit board and the bumps or the conductive balls (for example, see JP-A-2006-140273 (Patent Document 1)).

In a case where the lands at the circuit board side are connected to the lands at the flexible wiring board side through the burns or the like as in the case of the technique described in the Patent Document 1, a wire boding step which causes increase of the cost can be omitted to thereby reduce the cost, and also a space required for the electrical connection between the circuit board and the flexible wiring board. However, in a case where the lands at the circuit board side are connected to the lands at the flexible wiring board as in the case of the technique described in the patent document 1, when vibration acts on the circuit board or the like, the stress around the lands of the flexible wiring board is increased, so that the flexible wiring board may be damaged or reliability of terminal connection may be lost. Furthermore, when thermal impact is applied to the circuit board or the like, the stress around the lands of the flexible wiring board is increased due to the difference in thermal expansion coefficient between the circuit board and the flexible wiring board, so that the flexible wiring board may be damaged or the terminal connection reliability may be lost.

SUMMARY OF THE INVENTION

Therefore, the present invention has a main object to enhance reliability of an electronic circuit device by alleviating the stress acting on a flexible wiring board around a connection portion with connection terminals at a circuit board side.

In order to attain the above main object, an electronic circuit device according to the present invention adopts the following measures.

An electronic circuit device according to the present invention includes a circuit board having electronic parts, and flexible wiring board for enabling electrical connection between the circuit board and external equipment, wherein the circuit board has plural circuit-side connection terminals juxtaposed on a mount surface having the electrical parts mounted thereon or a non-mount surface corresponding to a surface at the opposite side to the mount surface, and the flexible wiring board has plural wiring-board-side connection terminals juxtaposed on any one of both the surfaces thereof so that the wiring-board-side connection terminals confront the circuit-side connection terminals of the circuit board, and plural free-end portions each of which is formed so as to include at least one of the wiring-board-side connection terminals, and the free-end portions of the flexible wiring board are not adhesively attached to the circuit board, and the circuit-side connection terminals are electrically connected to the corresponding wiring-board-side connection terminals while the circuit-side connection terminals confront the wiring-board-side connection terminals.

The flexible wiring board of the electronic circuit device has the plural wring-board-side connection terminals that are juxtaposed on any one of both the surfaces thereof so as to confront the plural circuit-side connection terminals juxtaposed on the mount surface or non-mount surface of the circuit board, and the plural free-end portions each of which is formed so as to include at least one wiring-board-side connection terminal. The free-end portions of the flexible wiring board are not adhesively attached to the circuit board, and the circuit-side connection terminals of the circuit board and the corresponding wiring-board-side connection terminals are electrically connected to one another so as to confront one another. Accordingly, each free-end portion of the flexible wiring board is movable to some degree with respect to the circuit board. Therefore, even when vibration acts on or thermal impact is applied to the circuit board or the like, the stress acting on the flexible wiring board around the connection portion to the circuit-side connection terminals can be alleviated. As a result the reliability of the surrounding of the connection portion between the circuit-side connection terminal and the wiring-board-side connection terminal, and thus the electronic circuit device can be enhanced.

Furthermore, each of the free-end portions of the flexible wiring board may be compartmented by a first slit formed in the flexile wiring board so as to extend in a juxtaposition direction of the wiring-board-side connection terminals, and plural second slits each of which is formed in the flexible wiring plate between the adjacent wiring-board-side connection terminals so as to extend from the first slit to a position beyond the wiring-board-side connection terminals in a direction substantially-perpendicular to the juxtaposition direction. Accordingly, the free-end portions can be easily constructed. The first and second slits may be designed to have some slight width or a simple incision.

The electronic circuit device may further comprises a radiation member that is adhesively attached to sites other than the free-end portions of the flexible wiring plate from an opposite side to the circuit board, the plural circuit-side connection terminals may be arranged in juxtaposition to one another on the non-mount surface of the circuit board, the plural wiring-board-side connection terminals may be arranged in juxtaposition to one another on the opposite side surface to an adhesion surface of the flexible wiring board to the radiation member, and an opening may be formed in the radiation member so as to confront the plural wiring-board-side connection terminals of the flexible wiring board. By using the radiation member as described above, the radiation performance of the circuit board can be secured. Furthermore, when the opening is formed in the radiation member so that the opening confronts the wiring-board-side connection terminals of the flexible wiring board, by inserting the heater in the opening of the radiation member and heating the circuit-side connection terminals and the wiring-board-side connection terminals under the state that the circuit-side connection terminals juxtaposed on the non-mount surface of the circuit confront the wiring-board-side connection terminals juxtaposed on the opposite side surface of the flexible wiring board to the adhesion surface to the radiation member, the circuit-side connection terminals of the circuit board and the corresponding wiring-board-side connection terminals of the flexible wiring board can be easily connected to one another.

Furthermore, the flexible wiring board may be not adhesively attached to at least a part of both the end portions in the juxtaposition direction of the radiation member. That is, when the opening is formed in the radiation member, the radiation performance of the radiation member is lowered by the amount corresponding to the opening. Accordingly, for example, the width of the radiation member in the juxtaposition direction of the wiring-board-side connection terminals is enlarged, and the flexible wiring board is not adhesively attached to at least a part of both the end portions in the juxtaposition direction of the radiation member, whereby the radiation performance of the radiation member can be excellently secured.

Furthermore, the plural circuit-side connection terminals may be arranged in juxtaposition to one another on the mount surface of the circuit board, the plural wiring-board-side connection terminals may be arranged in juxtaposition to one another on an opposite side surface to the circuit board side of the flexible wiring board, and the circuit-side connection terminals and the corresponding wiring-board-side connection terminals may be electrically connected to one another while the plural free-end portions of the flexible wiring board run on the circuit board. Even in the case of use of the structure as described above, when vibration acts on or thermal impact is applied to the circuit board or the like, the stress acting on the flexible wiring board around the connection portion to the circuit-side connection terminals can be alleviated. Furthermore, the stress alleviation can be more effectively performed by providing the free-end portions of the flexible wiring board with flexure.

Furthermore, the flexible wiring board includes wiring conductors connected to the wiring-board-side connection terminals, a heat transfer material that is thermally connected to the wiring conductors from an opposite side to the wiring-board-side connection terminals, a first cover film for covering one surfaces of the wiring conductors under the state that the wiring-board-side connection terminals are exposed to the outside, and a second cover film for covering the other surfaces of the wiring conductors under the state that the heat transfer material is exposed to the outside. Accordingly, by applying heat to the heat transfer material exposed from the second cover film, the circuit-side connection terminals and the wiring-board-side connection terminals can be heated, so that the connection processing between the circuit-side connection terminals and the wiring-board-side connection terminals can be easily and efficiently executed.

An opening may be formed in the flexible wiring board so as to confront the non-mount surface of the circuit board, the non-mount surface of the circuit board and the radiation member may be adhesively attached to each other through a radiation adhesive agent formed in the opening, and the flexible wiring board may include a spacer portion to be adhesively attached to the circuit board and the radiation member, the spacer portion being provided between the opening and the free-end portions. Accordingly, the radiation performance of the circuit board of the electronic circuit device can be excellently secured with a simple structure, and also the non-mount surface of the circuit board and the radiation member can be excellently insulated from each other. Furthermore, by providing (leaving) the spacer portion between the opening and the free-end portions, the thickness of the radiation adhesive layer can be managed by the thickness of the spacer portions concerned.

The electronic circuit device may further comprises a sealing resin portion that is formed of resin by molding so as to seal the circuit board and a part of the flexible wiring board.

DETAILED DESCRIPTION OF THE EMBODIMENTS

Next, a mode for carrying out the present invention will be described by using an embodiment.

Figure 1:
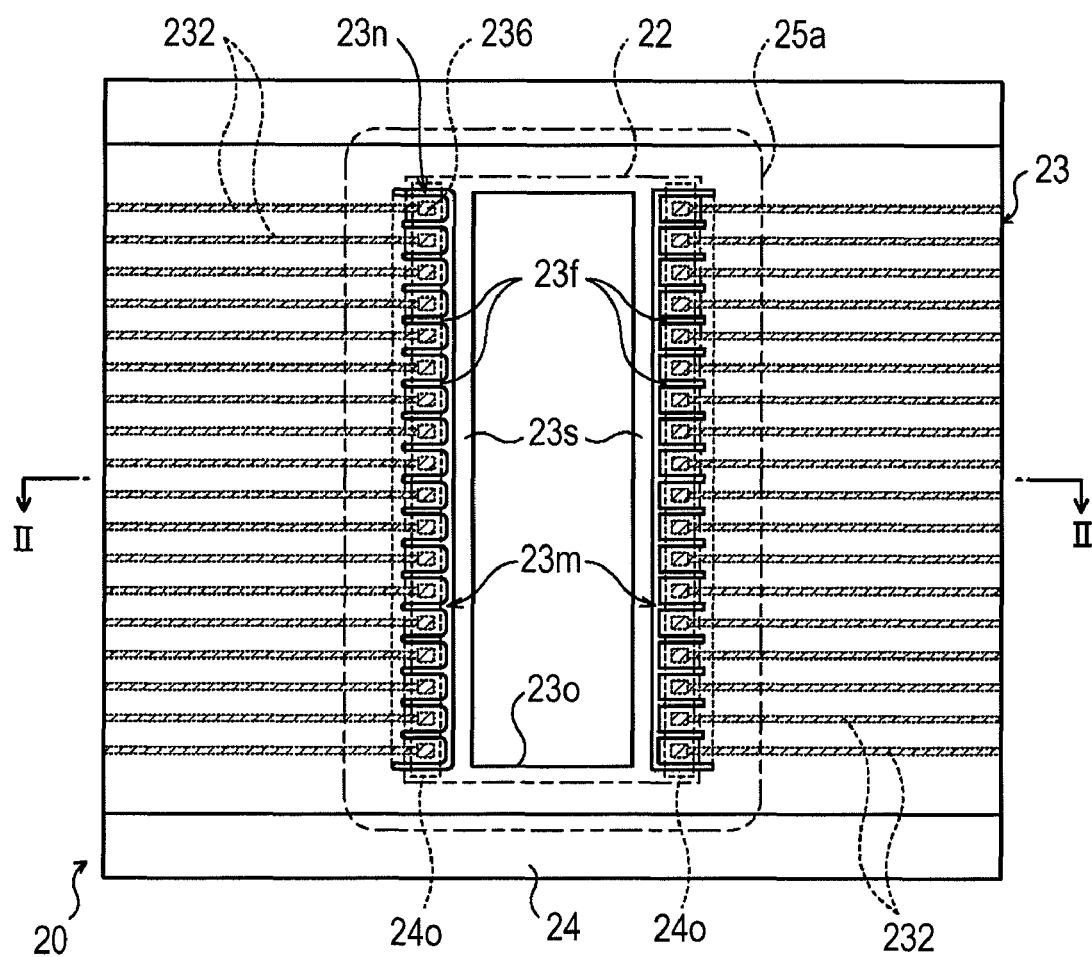
FIG. 1 is a plan view showing an electronic circuit device according to an embodiment of the present invention.
Figure 2:
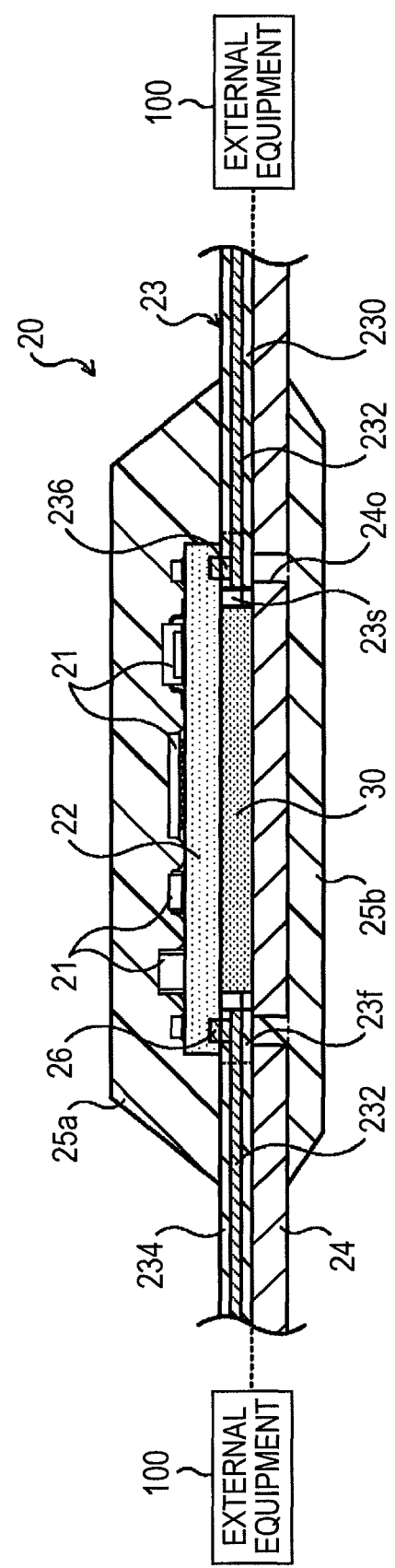
FIG. 2 is a cross-sectional view taken along II-II line of FIG. 1.

FIG. 1 is a plan view showing an electronic circuit device according to an embodiment of the present invention, and FIG. 2 is a cross-sectional view taken along II-II line of FIG. 1. The electronic circuit device 20 shown in these figures is constructed as an electric control device for controlling an automatic transmission for a vehicle (not shown), and for example, it is mounted on a unit table fixed at the lower portion of a transmission case. The electronic circuit device 20 of this embodiment has a circuit board 22 on which various kinds of electrical parts 21 are mounted, a flexible wiring board (FPC: Flexible Printed Circuit Board) 23 which is adhesively attached to the circuit board 22 to enable the electrical connection between the circuit board 22 and external equipment 100, a radiation plate (heat sink) 24 adhesively attached to the flexible wiring board 23, and sealing resin portions 25*a* and 25*b* formed of resin so as to seal the circuit board 22, a part of the flexible wiring plate 23 and a part of the radiating plate 24.

Figure 3:
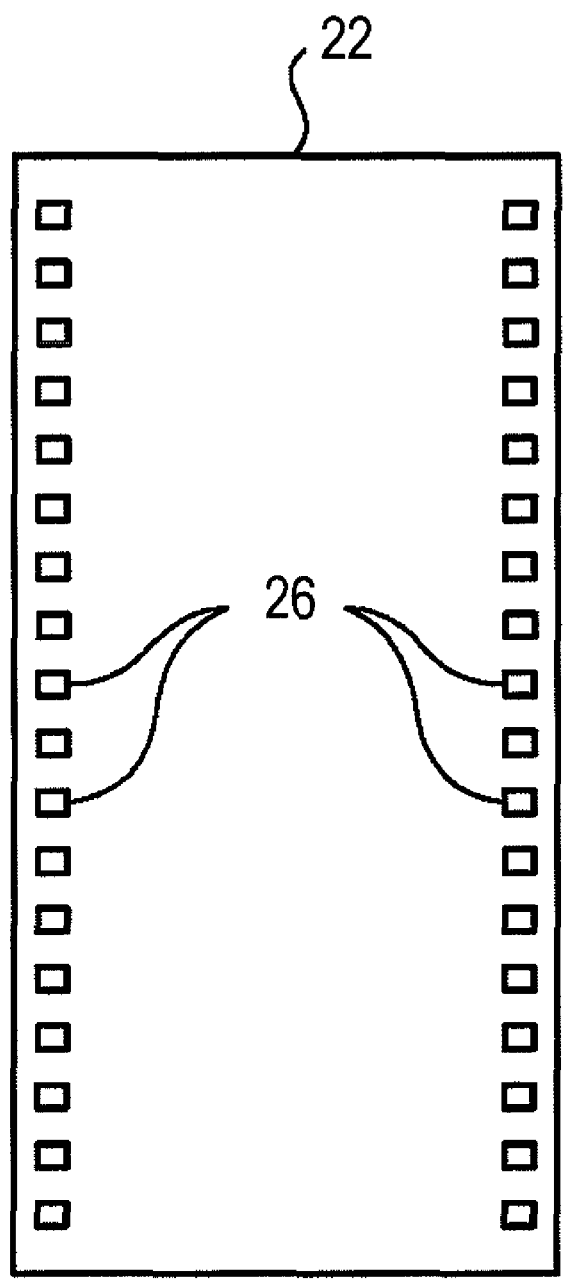
FIG. 3 is a diagram showing a non-mount surface of a circuit board.

The circuit board 22 comprises a base material formed of a material such as ceramic which is excellent in heat resistance and thermal conductivity and has a relatively small thermal expansion coefficient, and has a wiring pattern formed on one surface of the base material. The surface on which the wiring pattern of the circuit board 22 is formed serves as a mount surface of plural electronic parts 21 including an IC chip. Furthermore, on a non-mount surface corresponding to the surface at the opposite side to the mount surface of the circuit board 22, plural connection terminals (circuit-side connection terminals) 26 connected to the wiring pattern at the mount surface side are juxtaposed to one another along a pair of confronting side edge portions of the circuit 22 as shown in FIG. 3. That is, the circuit board 22 has two arrays of plural connection terminals 26 on the non-mount surface. A test terminal (not shown) used when a conducting test, a function test, etc. for circuits on the circuit board 22 are executed may be disposed on the non-mount surface of the circuit board 22.

Figure 4:
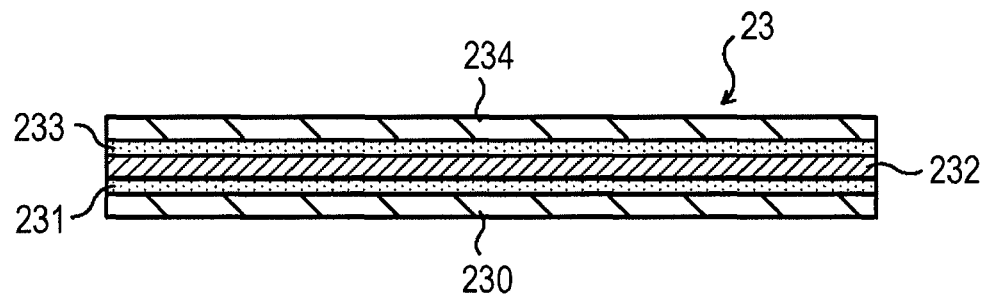
FIG. 4 is a cross-sectional view showing an example of a flexible wiring board.

The flexible arrangement board 23 is a deformable wiring material having flexibility, and it has a thickness of about 0.1 mm to 0.2 mm, for example. The flexible wiring board 23 included in the electronic circuit device 20 of this embodiment has a so-called single-sided structure as shown in FIG. 4, and it includes a base film 230 formed of resin such as polyimide resin, wiring conductors 232 formed of copper foil or the like which are adhesively attached onto the base film 230 through an adhesive layer 231, and a cover film 234 which is adhesively attached to the wiring conductors 232 and the base film 230 through an adhesive layer 233 to cover the wiring conductors 232. A connector (not shown) used for connection to external equipment 100 is connected to the flexible wiring board 23 (wiring conductors 232). The external equipment 100 connected to the circuit board 22 through the flexible wiring board 23 includes a solenoid valve included in a hydraulic circuit for actuating a hydraulic clutch and a hydraulic brake of an automatic transmission, various kinds of sensors such as an oil temperature sensor, a hydraulic sensor, etc., other electronic control units, etc.

As shown in FIG. 1, an opening 23o is formed in the flexible wiring board 23 so as to face the non-mount surface of the circuit board 22. In this embodiment, the size of the opening 23o is set so that the peripheral edge portion of the non-mount surface of the circuit board 22 is as large as possible to the extent that the peripheral edge portion concerned can sufficiently come into contact with the cover film 234 of the flexible wiring board 23. Furthermore, as shown in FIG. 1, the flexible wiring board 23 has plural connection terminals (connection terminals at the wiring board side) 236 which are connected to the corresponding wiring conductors 232 and disposed so as to confront the corresponding connection terminals 26 of the circuit board 22. In this embodiment, the connection terminals 236 are juxtaposed to one another along a pair of confronting edge portions of the opening 23o on the surface side of the flexible wiring board 23 (cover film 234 side). That is, the flexible wiring board 23 has two arrays of plural connection terminals 236 at the cover film 234 side, and each connection terminal 236 is exposed from the cover film 234 and electrically connected to the corresponding connection terminal 26 of the circuit board 22.

Figure 5:
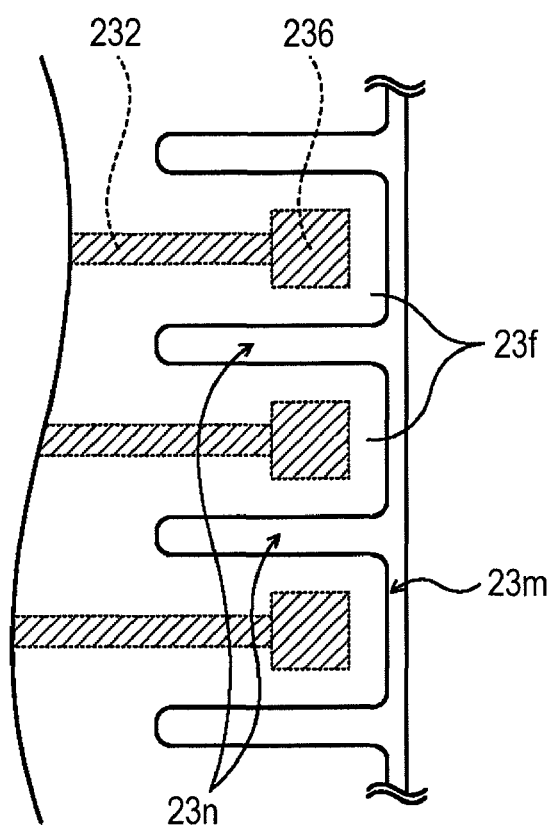
FIG. 5 is an enlarged view showing a main part of the flexible wiring board.

Furthermore, as shown in FIGS. 1 and 2, the flexible board 23 has plural free-end portions 23f each of which is formed so as to include at least one connection terminal 236, and a spacer portion 23s located between each free-end portion 23f and the opening 23o. As shown in FIG. 5, each free-end portion 23f is compartmented by a narrow first slit 23m formed in the flexible wiring board 23 so as to extend in the juxtaposing direction of the plural connection terminals 236, and plural second slits 23n each of which intercommunicates with the first slit 23m and extends between the adjacent connection terminals 26. That is, the first slit 23m is outwardly spaced from the edge portion of the opening 23o extending along the plural connection terminal 236 at a predetermined interval so as to extend in parallel to the edge portion, whereby a narrow spacer portion 23s is formed (left) between the opening 23o and the first slit 23m. Furthermore, in this embodiment, as shown in FIG. 5, each second slit 23n extends outwardly from the first slit 23m so as to be substantially perpendicular to the first slit 23m until it is beyond the connection terminal 26 to some degree, and a slight gap is formed between the adjacent free-end portions 23f. The non-mount surface of the circuit board 22, excluding the respective free-end portions 23f, is adhesively attached to the flexible wiring board 23 (cover film 234) having the above construction through the opening 23o so as to face the radiation plate 24.

The radiation plate 24 is, for example, a rectangular plate member formed of low expansion metal such as ordinary steel (SPCC) or clad material which has a relatively small thermal expansion coefficient in this embodiment. A plate member formed of a material having an excellent thermal conductivity such as aluminum plate or steel product may be used. As shown in FIGS. 1 and 2, two elongated openings 24o are formed in the radiation plate 24 so as to face the plural connection terminals 236 of the flexible wiring board 23. As shown in FIG. 2, the radiation plate 24 is adhesively attached to the base film 230 of the flexible wiring board 23 excluding the respective free-end portions 23f from the opposite side to the circuit board 22 through a silicon type radiation adhesive layer (not shown), and also is adhesively attached to the non-mount surface of the circuit board 22 through an adhesive layer 30 formed of silicon type radiation adhesive agent formed in the opening 23o. That is, in the electronic circuit device 20 of this embodiment, the circuit board 22 is thermally connected to the radiation plate 24 through the adhesive layer 30 which has a relatively broad area and is formed of radiation adhesive agent. Furthermore, the radiation plate 24 of this embodiment has a longer width than the width of the flexible wiring board 23 (the length in the juxtaposing direction of the connection terminals 26), and in the electronic circuit device 20 of this embodiment, areas where the flexible wiring board 23 is not adhesively attached exist at both the end portions in the width direction of the radiation plate 24 as shown in FIG. 1.

The circuit board 22, the flexible wiring board 23 and the radiation plate 24 which are adhesively attached to one another and integrated are set in a metal mold, thermosetting resin such as epoxy resin is heated and pressurized to be molten, and a transfer molding process of ejecting the molten resin into the mold and pressurizing the molten resin is executed to form the sealing resin portions 25a and 25b. As shown in FIGS. 1 and 2, the sealing resin portion 25a at the upper side of the figures seals the circuit board 22 and a part of the flexible wiring board 23, and the sealing resin portion 25b at the lower side of the figures seals a part of the radiation plate 24. The shape (mass) and the position of the sealing resin portion 25a at the upper side of the figures and the sealing resin portion 25b at the lower side of the figures are set so that the stress acting between the sealing resin portion 25a, 26b and the other members is alleviated. Furthermore, in this embodiment, the sealing resin portions 25a and 25b are formed so that the portions of the radiation plate 24 to which the flexible wiring board 23 is not adhesively attached are sufficiently exposed. ATF (Automatic Transmission Field) is introduced to the unit table of the automatic transmission on which the electronic circuit device 20 of the embodiment is disposed, the exposed portions which are not sealed by the sealing resin portions 25a and 25b of the radiation plate 24 and the surfaces of the sealing resin portions 25a and 25b are heat-exchanged with ATF, whereby heat generated in the circuit board 22 is radiated to the outside.

Next, an example of the process of manufacturing the electronic circuit device 20 according to the embodiment will be described. When the electronic circuit device 20 is manufactured, the circuit board 22 on which the electronic parts 21 are mounted, the flexible wiring board 23 having plural connection terminals 236, plural free-end portions 23f and the spacer portion 23s, and the radiation plate 24 having plural openings 24o are prepared, and first the base film 230 of the flexible wiring board 23 and the radiation plate 24 are adhesively attached to each other by radiation adhesive agent while each opening 24o confronts the corresponding plural connection terminals 236. At this time, the respective free-end portions 23f (the base film 230) of the flexible wiring board 23 and the radiation plate 24 are not adhesively attached to each other by the radiation adhesive agent, however, each spacer portion 23s (base film 230) of the flexible wiring board 23 and the radiation plate 24 are adhesively attached to each other through the radiation adhesive agent.

Figure 6:
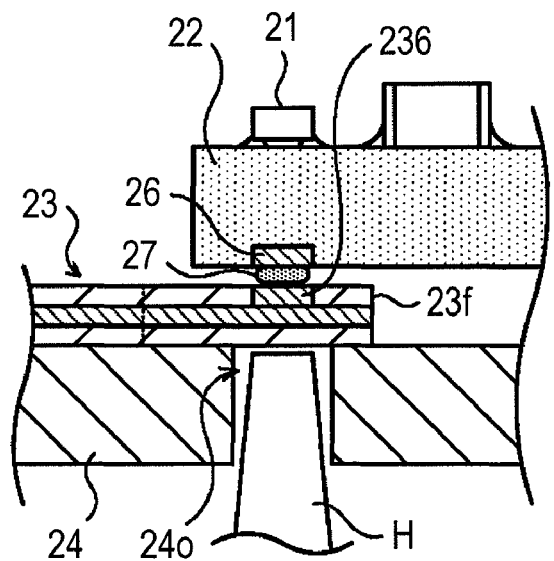
FIG. 6 is a cross-sectional view showing an example of a connection step of connection terminals of the circuit board and connection terminals of the flexible wiring board.

When the flexible wiring plate 23 and the radiation plate 24 are mutually adhesively attached to each other, the non-mount surface of the circuit board 22 and the cover film 234 of the flexible wiring board 23 are adhesively attached to each other by radiation adhesive agent, and the non-mount surface of the circuit board 22 and the radiation plate 24 are adhesively attached to each other by radiation adhesive agent disposed in the opening 23o of the flexible wiring board 23 while the respective connection terminals 26 of the circuit board 22 confront the corresponding connection terminals 236 on the surface of the flexible wiring board 23, that is, the surface opposite to the adhesion surface of the radiation plate 24. At this time, a bonding material 27 such as conductive adhesive agent such as ACF (Anisotropic Condactive Film) or the like, solder or conductive paste is disposed between the connection terminal 26 of the circuit board and the connection terminal 236 of the flexible wiring board 23 which confront each other as shown in FIG. 6. Furthermore, when the circuit board 22 and the flexible wiring board 23 are adhesively attached to each other, the circuit board 22 and each free-end portion 23f (the cover film 234) of the flexible wiring board 23 are not adhesively attached to each other by the radiation adhesive agent, however, the circuit board 22 and each spacer portion 23s (the cover film 234) of the flexible wiring board 23 are adhesively attached to each other through the radiation adhesive agent. As described above, when the spacer portion 23s to be adhesively attached to the circuit board 22 and the radiation plate 24 is provided (left) between the opening 23o of the flexible wiring board 23 and the free-end portions 23f, the thickness of the adhesive layer 30 can be more properly managed by the thickness of the spacer portion 23s concerned, and the insulating property of the non-mount surface of the circuit board 22 (for example, the test terminal (not shown)) can be more excellently secured while securing the radiation performance of the circuit board 22.

When the circuit board 22 is adhesively attached to the flexible wiring board 23 and the radiation plate 24, as shown in FIG. 6, a pulse heater H is inserted into the opening 24o of the radiation plate 24, the tip of the pulse heater H is pressed against the base film 230 of the flexible wiring board 23, and the bonding material 27 is heated and molten by pulse heat, whereby the confronting connection terminals 26 and 236 are electrically connected to each other. As described above, by forming the opening 24o in the radiation plate 24 so that the opening 24o confronts the connection terminals 236 of the flexible wiring plates 23, the connection terminals 26 of the circuit board 22 can be easily connected to the connection terminals 236 of the flexible wiring board 23.

Figure 7:
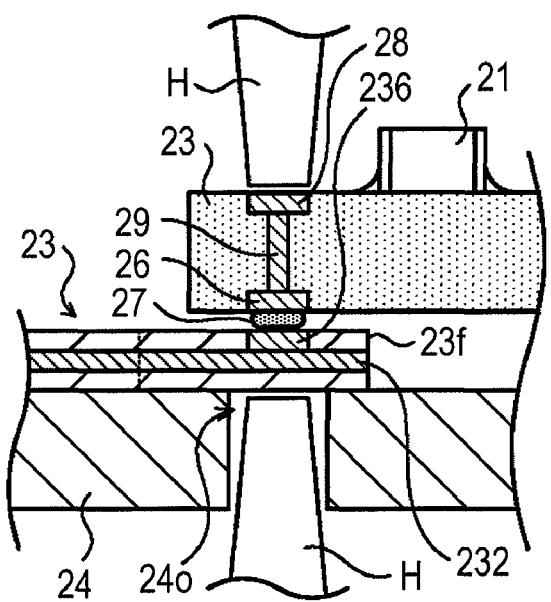
FIG. 7 is a cross-sectional view showing another example of the connection step of the connection terminals of the circuit board and the connection terminals of the flexible wiring board.

Here, when the bonding material 27 can be excellently heated and molten by only heat based on the pulse heater H through the opening 24o of the radiation plate 24, the electronic parts 21 can be also mounted on the back side of the connection terminals 26 of the circuit board 22 as shown in FIG. 6, so that the mount area of the circuit board 22 can be enlarged. In this case, thermally conducting pads (not shown) which are thermally connected to the connection terminals 236 through the wiring conductors 232 may be provided so as to be exposed from the base film 230, and the pulse heater H may be pressed against the thermally conducting pads. Furthermore, as shown in FIG. 7, the thermally conducting pad 28 may be disposed on the mount surface of the circuit board 22 so as to confront each connection terminal 26, and the thermally conducting pad 28 and the corresponding connection terminal 26 may be thermally connected to each other through a thermally conducting via 29. Accordingly, when the connection terminals 26 of the circuit board 22 are electrically connected to the connection terminals 236 of the flexible wiring board 23, heat can be applied to the bonding material 27 not only from the radiation plate 24 side, but also from the circuit board 22 by pressing the pulse heater H against the thermally conducting pads 28 as shown in FIG. 7. Therefore, the electrical connection between the connection terminal 26 and the connection terminal 236 can be quickly implemented, and also both the connection terminals can be more surely electrically connected to each other.

As described above, when the electrical connection between the connection terminals 26 of the circuit board 22 and the connection terminals 236 of the flexible wiring board 23 is completed, the circuit board 22, the flexible wiring board 23 and the radiation plate 24 which are mutually adhesively attached to one another and integrated are set in the metal mold, and the sealing resin portions 25a and 25b are formed by transfer molding. At this time, resin flows into the opening 24o of the radiation plate 24 as shown in FIG. 2, and thus the radiation performance of the radiation plate 24 of a completed electronic circuit device 20 is slightly reduced as compared with a case where no opening 24o exists in the radiation plate 24. Therefore, in this embodiment, as described above, the length in the width direction of the radiation plate (in the juxtaposition direction of the connection terminals 26) is set to be longer than the width of the flexible wiring board 23. In addition, the areas where the flexible wiring board 23 is not adhesively attached are secured at both the end portions in the width direction of the radiation plate 24, and also the sealing resin portions 25a and 25b are molded so that the portion of the radiation plate 24 to which the flexible wiring board 23 is not adhesively attached are sufficiently exposed. Accordingly, the radiation performance of the radiation plate 24 can be excellently secured.

As described above, the flexible wiring board 23 included in the electronic circuit device 20 of this embodiment has the plural connection terminals 236 which are juxtaposed to one another on the surface thereof (the surface at the opposite side to the adhesion surface to the radiation plate 24) so as to confront the plural connection terminals 26 juxtaposed to one another on the non-mount surface of the circuit board 22, and the plural free-end portions 23f each of which is formed so as to include one connection terminal 236. The free-end portions 23f of the flexible wiring board 23 are not adhesively attached to the circuit board 22 and the radiation plate 24, and the connection terminals 26 of the circuit board 22 are electrically connected to the corresponding connection terminals 236 under the state that the connection terminals 26 are electrically connected to the connection terminals 236. Accordingly, the respective free-end portions 23f of the flexible wiring board 23 are movable to some degree with respect to the circuit board 22 and the radiation plate 24 at least before the sealing resin portions 25a and 25b are molded. Therefore, even when vibration acts on or thermal impact is applied to the circuit board 22, the radiation plate 24 or the like during the manufacturing process of the electronic circuit device 20 or after the electronic circuit device 20 is completed, the stress acting on the flexible wiring board 23 can be alleviated around the connection portion of the circuit board 22 to the connection terminals 236. Accordingly, the reliability of the surrounding of the connection portion between the connection terminal 26 and the connection terminal 236, and thus the electronic circuit device 20 can be enhanced. Each of the free-end portions 23f of this embodiment is formed so as to include one connection terminal 236. However, this invention is not limited to this style. That is, the free-end portion 23f of the flexible wiring board 23 may be formed so as to include plural connection terminals 236 if the stress alleviating effect can be obtained.

Figure 8:
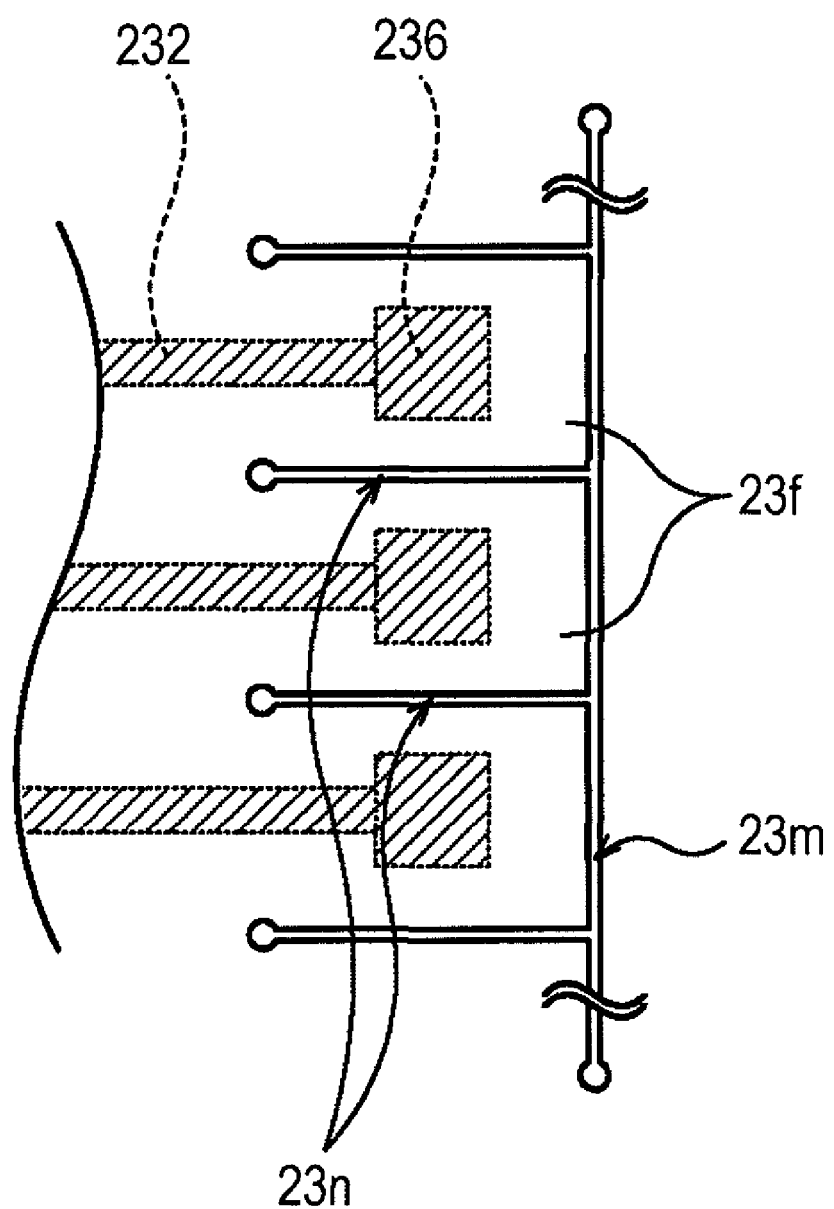
FIG. 8 is a cross-sectional view showing another example of a first slit and a second slit.

As in the above described embodiments, by forming in the flexible wiring board 23, the first slit 23m extending in the juxtaposition direction of the connection terminals 236, and the second slit 23n which extends from the first slit 23m in a direction substantially-perpendicular to the juxtaposition direction concerned between the adjacent connection terminals 236 and also extends beyond at least the connection terminal 236, the plural free-end portions 23f can be easily constructed. With respect to the first slit 23m and the second slit 23n, in place of a slit having have some slight width as shown in FIG. 4, a slit having a simple incision and a circular hole formed at the end portion of the incision concerned as shown in FIG. 8 may be adopted.

Furthermore, in the electronic circuit device 20 of this embodiment, the radiation plate 24 is adhesively attached to the sites other than the free-end portions 23f of the flexible wiring board 23 from the opposite side to the circuit board 22, and thus the heat radiation performance of the circuit board 22 can be secured. Furthermore, the opening 24o is formed in the radiation plate 24 so as to confront the plural connection terminals 236 of the flexible wiring board 23. Therefore, the connection terminals 26 of the circuit board 22 and the corresponding connection terminals 236 of the flexible wiring board 23 can be easily connected to one another by inserting the pulse heater H into the opening 24o of the radiation plate 24 and heating the connection terminals 26 and the connection terminals 236 under the state that the connection terminals 26 arranged in juxtaposition to one another on the non-mount surface of the circuit board 22 confront the connection terminals 236 arranged in juxtaposition to one another on the opposite side surface to the adhesion layer of the flexible wiring board 23 to the radiation plate 24. Furthermore, the flexible wiring board 23 is not adhesively attached to both the end portions of the radiation plate 24 in the juxtaposition direction of the connection terminals 236, and both the end portions concerned are not covered by the sealing resin portions 25a and 25b. Accordingly, even when the opening 24o having some degree of opening area is formed in the radiation plate 24, the radiation performance of the radiation plate 24 can be excellently secured.

The opening 23o is formed in the flexible wiring board 23 so as to confront the non-mount surface of the circuit board 22 and also the non-mount surface of the circuit board 22 and the radiation plate 24 are adhesively attached to each other through the adhesive layer 30 formed in the opening 23o, whereby the radiation performance of the circuit board 22 of the electronic circuit device 20 can be excellently secured with a simple construction and also the non-mount surface of the circuit board 22 (the test terminal) and the radiation plate 24 can be excellently insulated from each other. The spacer portion 23s to be adhesively attached to the circuit board 22 and the radiation plate 24 is provided (left) between the opening 23o of the flexible wiring board 23 and the free-end portions 23f, whereby the thickness of the adhesive layer 30 can be more properly managed by the thickness of the spacer portion 23s concerned.

Figure 9:
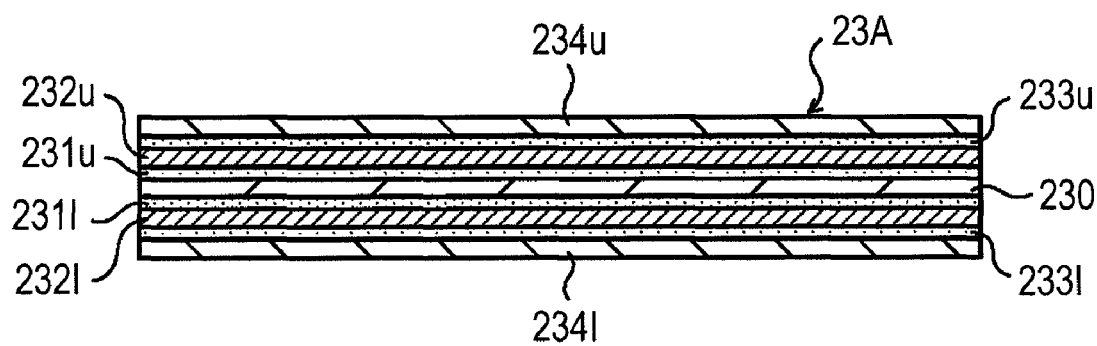
FIG. 9 is a cross-sectional view showing a flexible wiring board.

Furthermore, in the electronic circuit device 20, in place of the flexible wiring board 23 having a single-sided structure, a flexible wiring board 23A having a so-called double-sided structure as shown in FIG. 9 may be adopted. The flexible wiring board 23A shown in FIG. 9 includes a base film 230 formed of resin such as polyimide resin, wiring conductors 232u which are adhesively attached to one surface of the base film 230 through an adhesive layer 321u and formed of copper foil or the like, wiring conductors 232l which are adhesively attached through an adhesive layer 231l or directly deposited to the other surface of the base film 230 and formed of copper foil or the like, a cover film (first cover film) 234u which is adhesively attached to the wiring conductor 232u and the base film 230 through an adhesive layer 233u to cover the wiring conductors 232u, and a cover film (second cover film) 234l which is adhesively attached to the wiring conductors 232l and the base film 230 through an adhesive layer 233l to cover the wiring conductors 232l.

Figure 10:
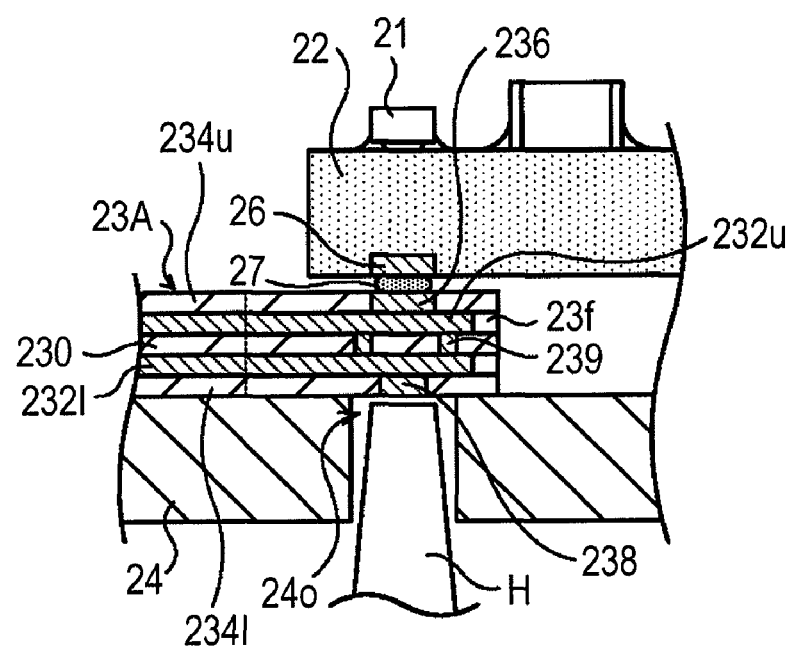
FIG. 10 is a cross-sectional view showing an example of the connection step of the connection terminals of the circuit board and the connection terminals of the flexible wiring board.

When the flexible wiring board 23A having the double-sided structure as described above is used, as shown in FIG. 10, a thermally conducting via 239 for thermally connecting the wiring conductors 232u connected to the connection terminals 236 to the wiring conductors 232l at the radiation plate 24 side (or the copper foil which is not used as the wire) is disposed in the same layer as the base film 230 in the flexible wiring plate 23A, and thermally conducting pads (heat transfer material) 238 which are thermally connected to the wiring conductors 232l at the radiation plate 24 side may be provided so as to be exposed from the cover film 234l at the radiation plate 24 side. As descried above, the pulse heater H is inserted into the opening 24o of the radiation plate 24, and the tip of the pulse heater H is pressed against the thermally conducting pads 238. Accordingly, even when the flexible wiring board 23A having the double-sided structure which is thicker than the flexible wiring board 23 having the single-sided structure is used, heat can be excellently transferred to the bonding material 27 to easily and efficiently execute the connection processing between the connection terminals 26 and the connection terminals 236.

Figure 11:
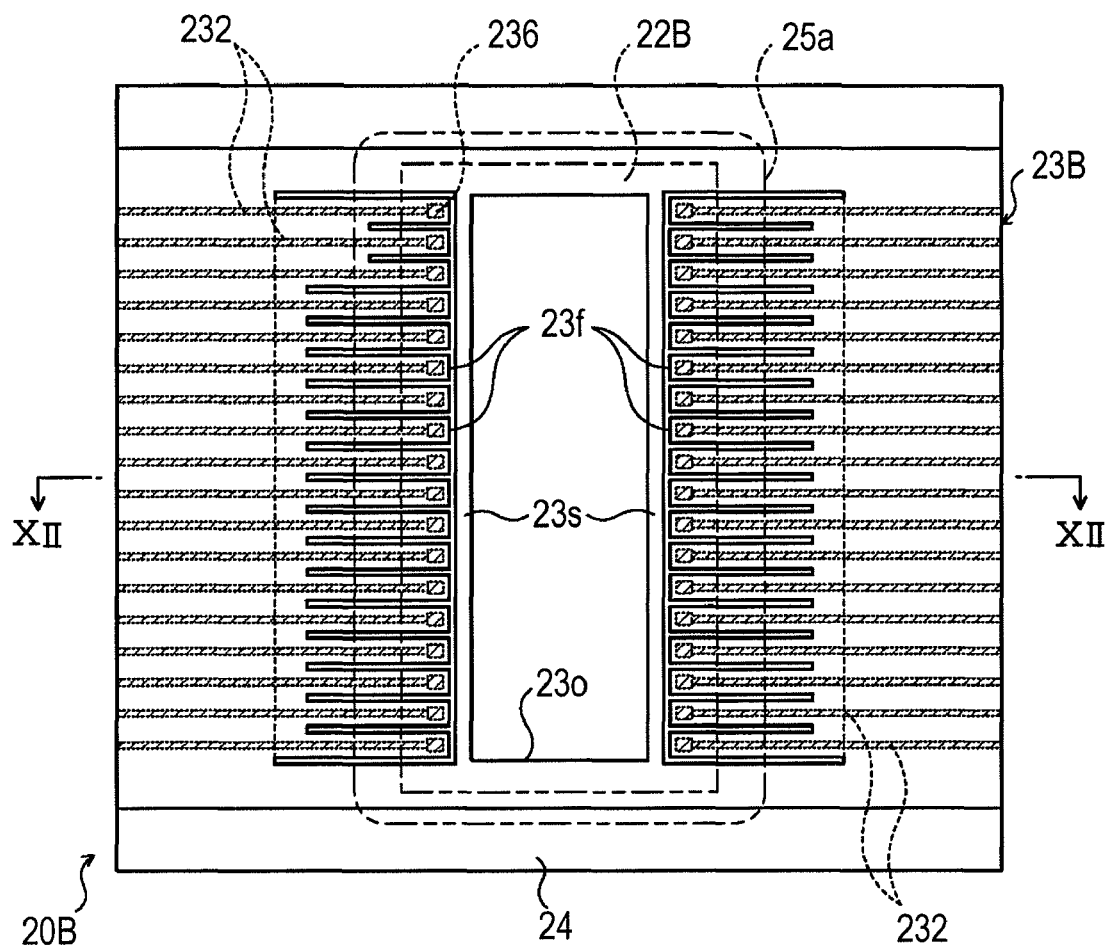
FIG. 11 is a plan view showing an electronic circuit device according to a modification.
Figure 12:
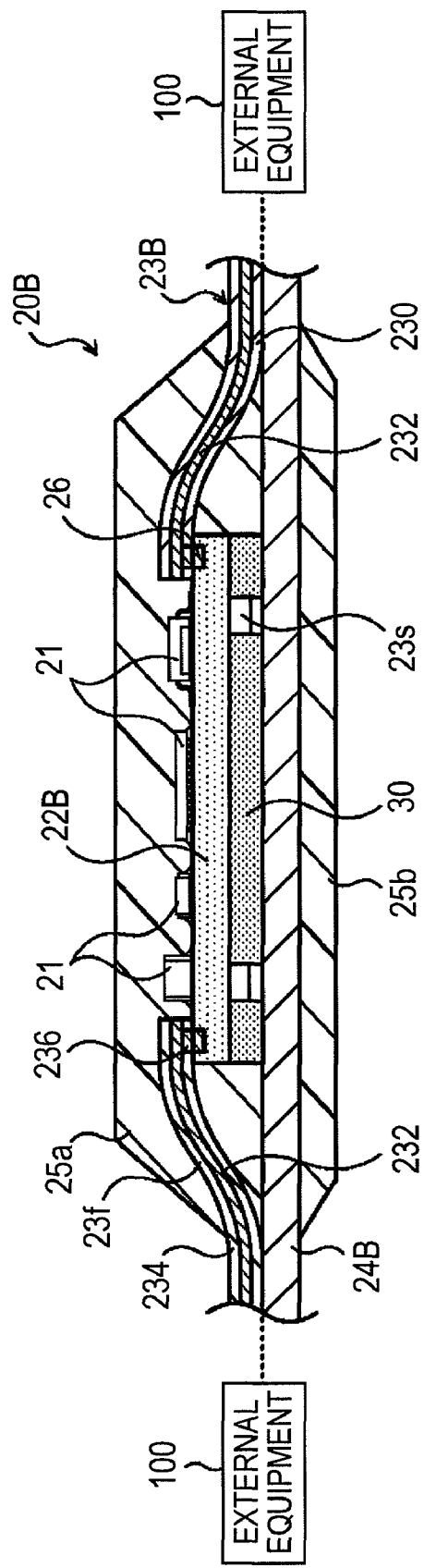
FIG. 12 is a cross-sectional view taken along XII-XII line of FIG. 1.

FIG. 11 is a plan view showing an electronic circuit device 20B according to a modification, and FIG. 12 is a cross-sectional view taken along XII-XII line of FIG. 11. In the electronic circuit device 20B shown in these figures, the plural connection terminals 26 are arranged in juxtaposition to one another on the mount surface of the circuit board 22B, and also the plural connection terminals 236 are arranged in juxtaposition to one another on the surface at the base film 230 side of the flexible wiring board 23B having the single-sided structure, that is, on the surface opposite to the adhesion surface to the circuit board 22B. Furthermore, as shown in FIG. 11, in the flexible wiring board 23B included in the electronic circuit device 20B, the slit extending between the adjacent connection terminals 26 is designed to be longer than the flexible wiring board 23 shown in FIG. 1, etc., so that the length of each free-end portion 23f is longer than the flexible wiring board 23 shown in FIG. 1, etc. Furthermore, no opening is formed in the radiation plate 24B of the electronic circuit device 20B. The connection terminals 26 of the circuit board 22B and the corresponding connection terminals 236 of the flexible wiring board 23B are electrically connected to one another while the plural free-end portions 23f run on the circuit board 22B as shown in FIG. 12. In the electronic circuit device 20B having the structure as described above, the stress acting on the flexible wiring board 23B around the connection portion of the circuit board 22B to the connection terminals 236 can be also alleviated when vibration acts on or thermal impact is applied to the circuit board 22B and the radiation plate 24B. Furthermore, as shown in FIG. 12, by providing the free-end portions 23f of the flexible wiring board 23B with flexure as shown in FIG. 12, the stress alleviation can be more effectively performed.

When the electronic circuit device 20B according to the modification is manufactured, the circuit board 22B having the electronic parts 21 mounted thereon, the flexible wiring board 23B having the plural connection terminals 236, the plural free-end portions 23f and the spacer portion 23s and the radiation plate 24B having no opening are first prepared. Thereafter, the base film 230 of the flexible wiring board 23B and the radiation plate 24B are adhesively attached to each other by the radiation adhesive agent. At this time, the respective free-end portions 23f (the base film 230) of the flexible wiring board 23B are not adhesively attached to the radiation plate 24B by the radiation adhesive agent, however, each spacer portion 23s (base film 230) of the flexible wiring board 23B and the radiation plate 24B are adhesively attached to each other through the radiation adhesive agent.

Subsequently, under the state that each free-end portion 23f of the flexible wiring board 23B runs on the circuit board 22B and also each connection terminal 26 of the circuit board 22B confronts the corresponding connection terminal 236 of the flexible wiring board 23B, the non-mount surface of the circuit board 22B and the cover film 234 of the flexible wiring board 23 are adhesively attached to each other by the radiation adhesive agent, and also the non-mount surface of the circuit board 22B and the radiation plate 24B are adhesively attached to each other by radiation adhesive agent disposed in the opening 23o of the flexible wiring board 23B. At this time, a bonding material such as ACF (Anisotropic Condactive Film) or the like is disposed between the connection terminal 26 of the circuit board 22B and the connection terminal 236 of the flexible wiring board 23B which confront each other. Furthermore, when the circuit board 22B and the flexible wiring board 23B are adhesively attached to each other, the circuit board 22B and each free-end portion 23f of the flexible wiring board 23B are not adhesively attached to each other by the radiation adhesive agent, however, the circuit board 22B and each spacer portion 23s (cover film 234) of the flexible wiring board 23B are adhesively attached to each other by the radiation adhesive agent.

When the circuit board 22B has been adhesively attached to the flexible wiring board 23B and the radiation plate 24B, the tip of the pulse heater is pressed against the cover film 234 of the flexible wiring plate 23B from the upper side of the connection terminals 236, and the bonding material is heated and molten by the pulse heat, whereby the confronting connection terminals 26 and 236 are electrical connected to one another. In this case, thermally conducting pads (not shown) to be thermally connected to the connection terminals 236 through the wiring conductors 232 may be provided so as to be exposed from the cover film 234, and the pulse heater may be pressed against the thermally conducting pads. Thereafter, the circuit board 22B, the flexible wiring board 23B and the radiation plate 24B which are adhesively attached to one another and thus integrated is set in a metal mold, and the sealing resin portions 25a and 25b are formed by transfer molding.

Figure 13:
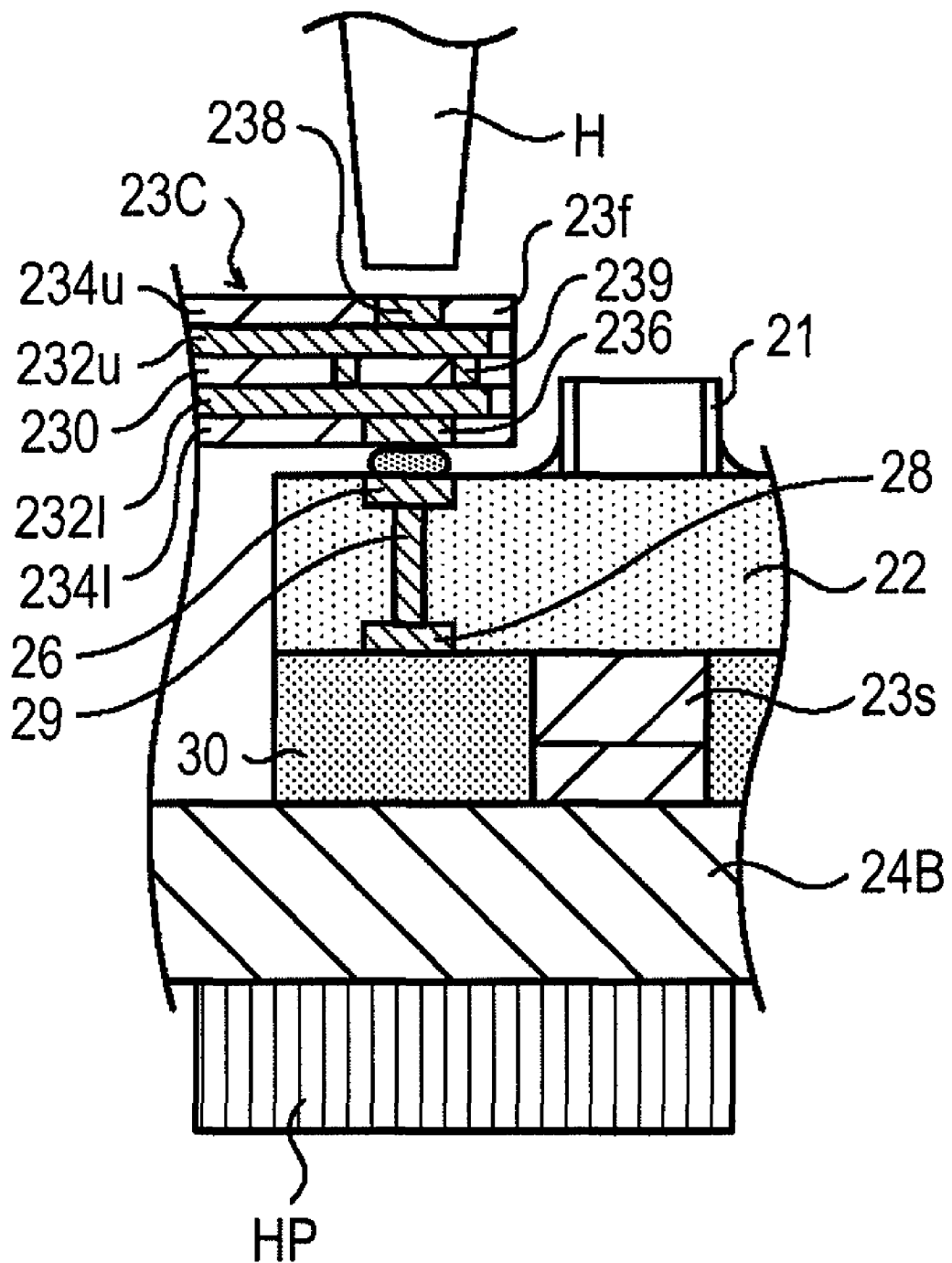
FIG. 13 is a cross-sectional view showing a manufacturing procedure of the electronic circuit device.

Furthermore, as shown in FIG. 13, in the electronic circuit device 20B of this modification, in place of the flexible wiring board 23B having the single-sided structure, a flexible wiring board 23C having a so-called double-sided structure may be adopted. When the flexible wiring board 23C having the double-sided structure is adopted, the thermally conducting via 239 for thermally connecting the wiring conductors 2321 at the radiation plate 24B side to be connected to the connection terminals 236 and the wiring conductors 232u at the upper side of FIG. 13 (or the copper film which is not used as the wire) is disposed in the same layer as the base film 230 in the flexible wiring board 23C, and the thermally conducting pads (heat transfer material) 238 to be thermally connected to the wiring conductors 232u at the upper side of FIG. 13 may be provided so as to be exposed from the cover film 234u at the upper side of FIG. 13. Accordingly, by pressing the tip of the pulse heater H against the thermally conducting pads 238, heat can be excellently transferred to the bonding material and the processing of connecting the connection terminals 26 and the connection terminals 236 can be easily and efficiently performed even when the flexible wiring board 23C having the double-sided structure which is thicker than the flexible wiring board 23 having the single-sided structure is used.

Furthermore, as shown in FIG. 13, the thermally conducting pads 28 are disposed on the non-mount surface of the circuit board 22 so as to confront the respective connection terminals 26, and also each thermally conducting pad 28 and each corresponding connection terminals 26 may be thermally connected through the thermally conducting via 29. Accordingly, when the connection terminals 26 of the circuit board 22 are electrically connected to the connection terminals 236 of the flexible wiring board 23, a hot plate HP is pressed against the radiation plate 24B, whereby heat can be applied to the bonding material 27 not only from the flexible wiring board 23C side, but also from the radiation plate 24B. Therefore, the electrical connection between the connection terminal 26 and the connection terminal 236 can be quickly implemented, and also both the connection terminals can be more surely electrically connected to each other.

In the electronic circuit devices 20 and 20B of the embodiment, the non-mount surface of the circuit board 22 and the flexible wiring board 23 are adhesively attached to each other. However, the circuit board 22 may be adhesively attached to only the radiation plate 24 and the flexible wiring board 23 may be adhesively attached to only the radiation plate 24 without adhesively attaching the circuit board 22 to the flexible wiring board 23. Furthermore, each of the electronic circuit devices 20 and 20B described above has the sealing resin portions 25a and 25b formed of resin which is molded so that the circuit board 22, a part of the flexible wiring board 23 and a part of the radiation plate 24 are sealed. However, in place of the sealing resin portions, the electronic circuit device 20, etc. may be equipped with a cover for covering the circuit board 22 and a part of the flexible wiring board 23. Still furthermore, the electronic circuit device 20, etc. described above are applied to control the automatic transmission for a vehicle, however, the present invention is not limited to this style. That is, the electronic circuit device 20, etc. may be constructed as an electrical control unit for controlling other in-vehicle mount equipment such as an internal combustion engine, an electric motor or the like, and may be constructed as an electronic circuit device for controlling equipment other than in-vehicle mount equipment.

Here, the corresponding relationship between the main elements of the embodiment and the modification and the main elements described in the column of "SUMMARY OF THE INVENTION" will be described. That is, in the embodiment and the modification, the circuit boards 22, 22B on which the electrical parts 21 are mounted correspond to "circuit board", and the flexible wiring boards 23, 23A, 23B, 23C for enabling the electrical connection between the circuit board 22 or the like and the external equipment 100 correspond to "flexible wiring board", the connection terminals 26 arranged in juxtaposition to one another on the mount surface or non-mount surface of the circuit board 22 correspond to "circuit side connection terminals", the connection terminals 236 arranged in juxtaposition to one another on any one of both the surfaces of the flexible wiring board 23 or the like so as to confront the plural connection terminals 26 of the circuit board 22 correspond to "wiring board side connection terminals", the free-end portions 23f each of which is formed so as to include at least one connection terminal 236 correspond to "free-end portions", the radiation plates 24, 24B adhesively attached to the flexible wiring board 23, etc. correspond to "radiation member", and the sealing resin portions 25a, 25b formed of resin so as to seal the circuit board 22 or the lie, a part of the flexible wiring board 23 and a part of the radiation plate 24 or the like correspond to "sealing resin portion". The corresponding relationship between the main elements of the embodiment and the modification and the main elements of the present invention described in the column of "SUMMARY OF THE INVENTION" is an example for specifically describing the best mode to implement the invention described in the column of "SUMMARY OF THE INVENTION" by using the embodiment, and thus the embodiment does not limit the elements of the invention described in the column of "SUMMARY OF THE INVENTION". That is, the embodiment is merely a specific example of the invention described in the column of "SUMMARY OF THE INVENTION", and the interpretation of the invention described in the column of "SUMMARY OF THE INVENTION" should be made based on the description of the column.

The mode of the present invention has been described by using the embodiment. However, the present invention is not limited to the embodiment, and various modifications may be made without departing from the subject matter of the present invention.

The present invention is applicable in manufacturing industries of electronic circuit devices.

What is claimed is:

1. An electronic circuit device comprising a circuit board having electronic parts, and flexible wiring board for enabling electrical connection between the circuit board and external equipment, wherein
    the circuit board has plural circuit-side connection terminals juxtaposed on a mount surface having the electrical parts mounted thereon or a non-mount surface corresponding to a surface at the opposite side to the mount surface,
    the flexible wiring board has plural wiring-board-side connection terminals juxtaposed on the mount surface or the non-mount surface thereof so that the wiring-board-side connection terminals confront the circuit-side connection terminals of the circuit board, and plural free-end portions each of which is formed so as to include at least one of the wiring-board-side connection terminals, and
    the free-end portions of the flexible wiring board are not adhesively attached to the circuit board, and the circuit-side connection terminals are electrically connected to the corresponding wiring-board-side connection terminals while the circuit-side connection terminals confront the wiring-board-side connection terminals,
    wherein each of the free-end portions of the flexible wiring board is compartmented by a first slit formed in the flexile wiring board so as to extend in a juxtaposition direction of the wiring-board-side connection terminals, and plural second slits each of which is formed in the flexible wiring plate between the adjacent wiring-board-side connection terminals so as to extend from the first slit to a position beyond the wiring-board-side connection terminals in a direction substantially-perpendicular to the juxtaposition direction.

2. The electronic circuit device according to claim 1, further comprising a radiation member that is adhesively attached to sites other than the free-end portions of the flexible wiring plate from an opposite side to the circuit board, wherein
    the plural circuit-side connection terminals are arranged in juxtaposition to one another on the non-mount surface of the circuit board,
    the plural wiring-board-side connection terminals are arranged in juxtaposition to one another on the opposite side surface to an adhesion surface of the flexible wiring board to the radiation member, and
    an opening is formed in the radiation member so as to confront the plural wiring-board-side connection terminals of the flexible wiring board.

3. The electronic circuit device according to claim 1, wherein the plural circuit-side connection terminals are arranged in juxtaposition to one another on the mount surface of the circuit board,
    the plural wiring-board-side connection terminals are arranged in juxtaposition to one another on an opposite side surface to the circuit board side of the flexible wiring board, and
    the circuit-side connection terminals and the corresponding wiring-board-side connection terminals are electrically connected to one another while the plural free-end portions of the flexible wiring board run on the circuit board.

4. The electronic circuit device according to claim 1, wherein the flexible wiring board includes a wiring conductor connected to the wiring-board-side connection terminals, a heat transfer material that is thermally connected to the wiring conductors from an opposite side to the wiring-board-side connection terminals, a first cover film for covering one surface of the wiring conductors under the state that the wiring-board-side connection terminals are exposed to the outside, and a second cover film for covering the other surface of the wiring conductors under the state that the heat transfer material is exposed to the outside.

5. The electronic circuit device according to claim 1, wherein an opening is formed in the flexible wiring board so as to confront the non-mount surface of the circuit board, the non-mount surface of the circuit board and the radiation member are adhesively attached to each other through a radiation adhesive agent formed in the opening, and the flexible wiring board includes a spacer portion to be adhesively attached to the circuit board and the radiation member, the spacer portion being provided between the opening and the free-end portions.

6. The electronic circuit device according to claim 1, further comprising a sealing resin portion that is formed of resin by molding so as to seal the circuit board and a part of the flexible wiring board.

7. The electronic circuit device according to claim 2, wherein the flexible wiring board is not adhesively attached to at least a part of both the end portions in the juxtaposition direction of the radiation member.

* * * * *